United States Patent [19]
McCann

[11] Patent Number: 4,599,579
[45] Date of Patent: Jul. 8, 1986

[54] FREQUENCY SYNTHESIZER HAVING JITTER COMPENSATION

[75] Inventor: Kenneth D. McCann, Reigate, England

[73] Assignee: U.S. Philips Corporation, New York, N.Y.

[21] Appl. No.: 545,552

[22] Filed: Oct. 26, 1983

[30] Foreign Application Priority Data

Nov. 5, 1982 [GB] United Kingdom ............. 8231709

[51] Int. Cl.$^4$ ............................................. H03B 7/00
[52] U.S. Cl. ................................... 331/1 R; 331/18
[58] Field of Search ...................... 331/1 A, 16, 18, 25

[56] References Cited

U.S. PATENT DOCUMENTS 4,442,412 4/1984 Smith ................................ 331/25

FOREIGN PATENT DOCUMENTS

1447418 8/1976 United Kingdom .

Primary Examiner—Eugene LaRoche
Assistant Examiner—G. Wan
Attorney, Agent, or Firm—Joseph P. Abate

[57] ABSTRACT

A frequency synthesizer includes frequency reduction means which includes a pulse swallow circuit PS which cancels cycles from the frequency Fo under the control of a rate multiplier RM. To prevent phase jitter at the output of phase comparator PC due to the cancelled cycles, a compensation signal HP is derived from a swallow command signal A and from a multiplying fraction n/x of the rate multiplier. In order to keep the DC level of the signal HP constant, the signal HP is bidirectional with respect to a mid-point voltage level and the total area of the pulses in one direction is the same as the total area of the pulses in the other direction. The invention is applicable to both phase locked loop synthesizers (FIG. 2) and direct synthesizers (FIG. 11).

14 Claims, 11 Drawing Figures

FREQUENCY SYNTHESIZER HAVING JITTER COMPENSATION

BACKGROUND OF THE INVENTION

This invention relates to a frequency synthesizer comprising a reference frequency generator coupled to a frequency control circuit which includes a variable frequency reduction means including a cycle cancellation circuit which is arranged to cancel a cycle of the frequency to be reduced by the reduction means for each input pulse to said cycle cancellation circuit from an offset frequency generator arranged to produce n pulses for each group of x pulses of a given frequency Fr to provide a variable offset frequency (n/x)Fr where n is any integer smaller than x, and further comprising a jitter compensation signal circuit connected to the frequency control circuit, an output of the jitter compensation signal circuit being arranged such that a compensation signal at the output causes compensation, at least partly, for any jitter in the period of the output frequency of the synthesizer that would otherwise be caused as a result of each cancelled cycle, which jitter compensation signal circuit derives the compensation signal as a function of the offset frequency via an analogue integrator.

Such a frequency synthesizer is described in United Kingdom Patent Application No. 8208094.

Frequency synthesizers to which the invention is applicable are either of the "direct" type in which the output frequency is derived directly from the reference frequency or of the "indirect", or phase locked loop, type in which the output frequency is generated by a voltage-controlled variable frequency oscillator forming part of a phase lock loop which locks the oscillator frequency to a predetermined rational fraction (which is to be understood herein as including a multiple) of the reference frequency.

In each type of frequency synthesizer, the cancellation of a cycle of the frequency to be reduced would, if preventive steps were not taken, produce a resultant jitter in the period of the output frequency. To prevent this, the compensation signal circuit produces a compensation signal which is a function of the offset frequency—i.e. the pulse train which in fact causes the jitter in the first place. The compensation signal is derived from these pulses by first removing their d.c. content, by a high pass filter for example, and then integrating the pulses to produce an analogue compensation signal.

If d.c. removal is accomplished by a high pass filter network, then to avoid distortion of the pulse train the filter time constant must be significantly larger than the period of the lowest frequency offset that can be introduced. The problem associated with this is that, in general, the d.c. level of the pulse train is different for different offset frequencies so that when the offset frequency is changed there is a period of time (proportional to the filter time constant) during which the (d.c.-blocking) capacitor in the high pass filter holds the incorrect voltage. This has the effect of temporarily distorting the compensation signal until the capacitor charges up or discharges to the correct d.c. level. For example, if the lowest offset frequency is 10 Hz then for the best final spectral purity the filter time constant should be of the order of one second. This will lead to unwanted spurii at the output of the synthesizer for about ten seconds after changing the offset frequency.

Thus, there is a conflict between the final spectral purity of the output frequency and the speed with which this can be achieved after a frequency change.

SUMMARY OF THE INVENTION

An object of the invention is to provide a frequency synthesizer in which the d.c. level of the high pass filter input signal does not significantly vary for different offset frequencies while preserving the a.c. information.

According to the invention there is provided a frequency synthesizer comprising a reference frequency generator, a frequency control circuit which includes a variable frequency reduction means including a cycle cancellation circuit which is arranged to cancel a cycle of the frequency to be reduced by the reduction means for each input pulse to said cancellation circuit from an offset frequency generator arranged to produce n pulses for each group of x pulses of a given frequency Fr to provide a variable offset frequency (n/x)Fr where n is any integer smaller than x, and a jitter compensation signal circuit connected to the frequency control circuit, the output signal of the jitter compensation signal circuit being arranged to compensate, at least partly, for any jitter in the period of the output frequency of the synthesizer that would otherwise be caused as a result of each cancelled cycle, which jitter compensation signal circuit derives the compensation signal as a function of the offset frequency via an analogue integrator, characterized in that the jitter compensation signal circuit includes means for generating, with respect to a given d.c. level, a bidirectional signal such that, for each group of x periods of Fr, there are n periods over each of which the integral of the bidirectional signal is proportional to $-(x-n)$, and $(x-n)$ periods of Fr over each of which the integral of the bidirectional signal is correspondingly proportional to n.

It will be appreciated from the above that the mean value of the bidirectional signal is always equal to the given d.c. level and, therefore, the average d.c. level of the pulses does not change with n or x. Thus, if the offset frequency is changed, the d.c. level does not change and the compensation signal is not distorted by the change. The synthesizer can therefore respond very rapidly to changes in offset frequency with the result that it can be used as a so-called "hopping" frequency synthesizer with very fine frequency resolution.

It will further be appreciated that the difference between the integral of the bidirectional signal during an Fr period when a cycle is cancelled and that during an Fr period when no cycle is cancelled is always constant irrespective of the offset frequency, i.e. $nk+(x-n)k=xk$ where k is a constant of proportionality and x is a constant for any particular frequency synthesizer. The reason for this is as follows.

When a cycle is cancelled, the compensation signal is required to change by an amount that will produce a phase correction of one cycle of the frequency to be reduced via a phase modulator placed either at one of the inputs or else at the output of the phase detector. The change in the compensation signal caused by the cancellation of a cycle during any Fr period is proportional to the difference between the actual value of the integral of the bidirectional signal and the value that would have resulted if the cycle had not been cancelled. This difference must be constant in order for the phase correction to be one cycle for all values of n.

A further advantage of a synthesizer according to the invention is that, due to the bidirectional pulse train, the output of the integrator is a stepped waveform as opposed to a ramp so that the output level of the integrator is always constant at a step level when sampled by a device through which the compensation signal is applied in order to remove any jitter in the output frequency. This results in the elimination of any errors due to small changes in the sampling instants (which are unavoidable with devices such as the voltage comparators used in most phase modulators).

A particularly convenient form of bidirectional signal is a train of bidirectional pulse relative to the given d.c. level such that one pulse occurs during every Fr period. The area of each pulse then gives the magnitude and the direction of each pulse gives the sign of the integral over one Fr period.

The areas of the pulses in the bidirectional pulse train may be varied by pulse width or pulse height modulation or by a combination of both. If the information concerning the offset frequency (i.e. the value of n) is available in analogue form, for example if the offset frequency generator is a voltage-controlled oscillator or pulse generator, then it is generally more convenient to use this analogue signal to determine the height of constant width pulses. If the information is in digital form, then it is generally more convenient to use this information to control the width of the pulses. An alternative form of pulse width modulation for present purposes may be provided by forming each pulse as one or more sub-pulses, for example clock pulses, each having the same area. In this case, each of the n pulses in one direction referred to above comprises $(x-n)$ sub-pulses and each of the $(x-n)$ pulses in the other direction comprises n sub-pulses. Thus, for this purpose, the term "pulse" as applied to the bidirectional signal is to be understood herein as a single pulse or as a plurality of sub-pulses.

It is known to provide a gain-controlled amplifier in the compensation signal path, the gain of which amplifier is an inverse function of the output frequency. The need for such an amplifier and its associated control circuitry is eliminated in an embodiment of the invention in which the areas of the pulses in the bidirectional signal are an inverse function of the output frequency. This can be achieved in a very simple manner by causing the pulse areas to be controlled by clock signals and deriving the clock pulses from the output frequency.

BRIEF DESCRIPTION OF THE DRAWING

Embodiments of the invention will now be described with reference to the accompanying drawings, of which.

DESCRIPTION OF THE PREFERRED EMBODIMENTS

Figure 1:
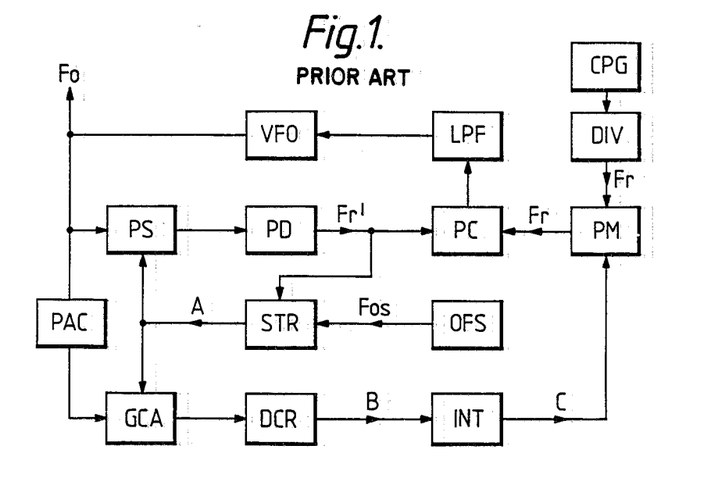
FIG. 1 is a block schematic circuit diagram of a known frequency synthesizer.

FIG. 1 shows a known form of phase locked loop frequency synthesizer comprising a voltage-controlled variable frequency oscillator VFO the output of which constitutes the synthesizer output (frequency Fo) and is connected to one input of a cycle cancellation, or "pulse swallow", circuit PS. The output of circuit PS is connected to a programmable divider PD which divides by an adjustable number $N \geq 1$. The output of divider PD is connected to a first comparison input of a phase comparator PC and also to the strobe input of a strobing circuit STR. The other input of circuit STR is connected to the output of an offset frequency generator OFS having a variable frequency Fos in a range which is low relative to the output frequency range of the synthesizer. For example, the synthesizer may have an output frequency range of 1.6 MHz to 30 MHz adjustable by divider PD in 1 kHz steps and the variable offset frequency generator OFS may have a range of 0 to 990 Hz variable in 10 Hz steps under the control of an input factor n. The generator may, for example, derive the offset frequency from a clock pulse generator CPG or from the output of divider PD, the connections thereto not being shown in the Figure. Thus, for example, the generator OFS may comprise a rate multiplier and a divider as shown at RM and D1 respectively in FIG. 3 of U.K. Patent Specification No. 1,447,418 or may simply comprise a rate multiplier R as shown in FIG. 2 of that specification. The offset frequency generator may alternatively generate an offset frequency directly in response to an analogue or a digital input.

The output of strobing circuit STR is connected to the "swallow" command input of pulse swallow circuit PS and also to the input of a d.c. removal circuit DCR via a gain-controlled amplifier GCA. The output of circuit DCR is fed via an analogue integrator INT to the phase control input of a phase modulator PM. The clock pulse generator CPG provides pulses having a high stable repetition rate (frequency) and the frequency of these pulses is, if required, divided down in a divider DIV to provide a reference frequency Fr (e.g. 1000 p.p.s.) which is fed via the phase modulator PM to a second comparison input of phase comparator PC. The output signal from comparator PC is fed to the frequency control input of oscillator VFO via a low-pass loop filter LPF.

The operation of the phase lock loop control circuit VFO-PS-PD-PC-LPF-VFO is well known and is described in terms of these referenced items in the above-mentioned U.K. Patent Specification No. 1,447,418. Briefly, the output signal of comparator PC is integrated in a low-pass filter LPF and adjusts the frequency of the oscillator VFO until the phase of the signal fed to the first comparison input of comparator PC from divider PD is identical to the phase of the signal fed to the second comparison input of the comparator PC via phase modulator PM. If the relative phases of the two input signals to comparator PC tend to differ slightly, then the output signal of comparator PC changes accordingly in such a direction that the phase of oscillator VFO is shifted to reduce the phase difference between the two input signals to comparator PC to zero.

The remainder of the circuit operates as follows. Output pulses from the generator OFS, having an average frequency Fos, are strobed in circuit STR by the output pulses of divider PD to produce output pulses of a defined length. These pulses operate circuit PS in precisely the same manner as the corresponding pulses Fr in FIG. 2 of said U.K. Patent Specification No. 1,447,418 and offset the output frequency Fo by Fos. Thus, Fos may be selected to give a very fine control of the output frequency Fo. These pulses form a pulse signal A which is applied to a d.c. removal circuit DCR which either removes any d.c. component in the pulse signal (e.g. by a series capacitor or high pass filter) or compensates for any saturation effect the d.c. may give rise to in the integrator. The resulting signal B is integrated by an analogue integrator INT to produce a signal C which is used to control the phase delay generated by phase modulator PM.

As described above, the operation of the circuit PS in response to the pulse signal A causes jitter in the pulses appearing at the output of divider PD, this jitter appearing as a phase delay in the pulses each time circuit PS is caused to swallow a pulse by the arrival of a pulse in signal A. This same pulse is used, via the circuit elements DCR and INT, to cause a corresponding phase delay in the pulse from phase modulator PM. Thus, the pulse from modulator PM to comparator PC is delayed to substantially the same extent as the jitter delay in the corresponding pulse from divider PD and the effects of jitter on the output frequency Fo of oscillator VFO are at least very substantially reduced.

In effect, the signal C has a value which predicts any phase delay resulting from jitter and compensates for this delay accordingly. As would be expected, as the offset frequency Fos is increased, so the amount of jitter per unit of time increases and the slope of the jitter-compensating signal C increases. The average value of the signal B is zero, due to the removal of the d.c. content, and hence the signal C is a function of the amount of jitter caused by the pulse swallowing technique. However, the voltage step out of the phase comparator PC when a pulse is subtracted at the input to divider PD is proportional to the length of the pulse (i.e. one cycle of the VFO output frequency) and is therefore inversely proportional to the frequency Fo. Thus, in the case of a frequency synthesizer having a range of 1.6 MHz to 30 MHz, the amplitude of the signals dealt with by the jitter compensation circuit can vary if the synthesizer is switched from one end of its output frequency range to the other. This can cause inaccuracies in the jitter correction signal C and a gain-controlled amplifier GCA is included in the correction signal circuit, the gain of the amplifier being controlled by a period-to-analogue converter PAC having the frequency Fo fed to its input. In this way, a very precise and accurate compensation for the effects of jitter is provided over the whole frequency range.

The analogue output of integrator INT has a sawtooth waveform with a smooth ramp. This waveform is sampled at an instant in each cycle of the frequency Fr in order to shift the output phase of the phase modulator PM to effect the required phase compensation. Any variation in these sampling instants will therefore produce small phase errors in the output of modulator PM.

Figure 2:
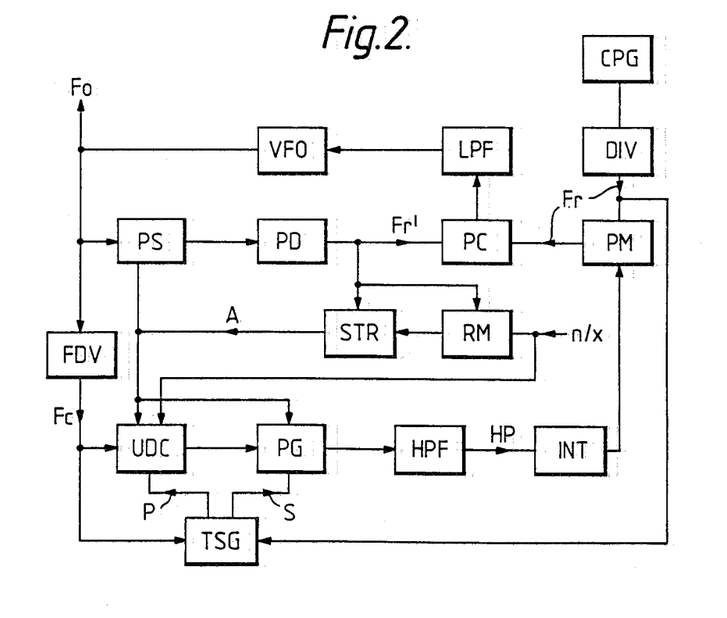
FIG. 2 is a block schematic circuit diagram of a first frequency synthesizer according to the invention.

FIG. 2 is a block schematic circuit diagram of a synthesizer according to the invention which is based on the synthesizer shown in FIG. 1. The various circuit blocks common to both Figures are given the same references. It will be noted that the function of the offset frequency generator OFS in FIG. 1 is performed by a rate multiplier RM which multiplies the input frequency of the pulses Fr' by a factor n/x. In most synthesizers x is a multiple of 10, typically 100; so n is a decimal fraction. In the present example, the value of x is assumed to be 10. If n for example has the value 3 (n/x =0.3), then for every ten input pulses to rate multiplier RM from the output pulses Fr' of divider PD the rate multiplier provides three output pulses. It will also be noted that the converter PAC and amplifier GCA of FIG. 1 are replaced by a fixed frequency divider FDV, an up/down modulus x counter UDC, and a pulse generator PG. The DC removal circuit DCR of FIG. 1 is shown as a high pass filter HPF in FIG. 2. A timing signal generator TSG supplies control pulses P and S to counter UDC and pulse generator PG, respectively.

The function of frequency divider FDV is merely to reduce the output frequency Fo to a suitable value to serve as clock pulses Fc for the counter UDC and timing signal generator TSG. It may not be required in some cases.

The up/down count control input of counter UDC is fed with signal A and is arranged to count down if a swallow pulse is present in signal A (A="1") and to count up if no pulse is present (A="0"). Pulse generator PG is fed with sampling pulses at the frequency Fr.

The operation of the synthesizer is the same as that described with reference to FIG. 1 except for the operation of circuit blocks FDV, UDC, PG, and TSG—the operation of which will now be described with reference to FIGS. 3 to 7. It is assumed that the clock frequency Fc is fifteen times the sampling frequency Fr; that is to say that there are fifteen clock pulses in each period of Fr.

Figure 3:
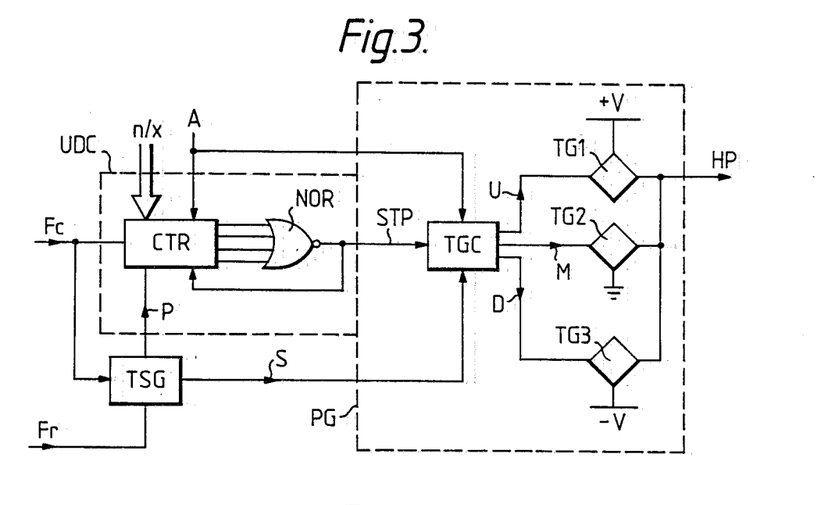
FIG. 3 is a schematic circuit diagram showing details of blocks UDC and PG of FIG. 2.

Referring first to FIG. 3, which in effect functions as a DC suppression circuit, up/down counter UDC comprises a known presettable up/down counter CTR, for example Philips integrated circuit HEF 4510, the four count output bits of which are fed to a NOR-gate NOR the output of which is connected to the "count disable" input of the counter and to the "stop pulse" input STP of a transmission gate controller TGC forming part of the pulse generator PG. Controller TGC provides a control signal on any one of leads U, M, and D to control the switching of three transmission gates TG1, TG2, and TG3, respectively. These gates may, for example, be provided as a Philips integrated circuit HEF 4066B. A control signal on lead U causes gate TG1 to connect a positive DC voltage to the output lead HP to the filter HPF. A control signal on lead D causes gate TG3 to connect a negative DC voltage to lead HP and a control signal on lead M causes a mid-rail DC voltage (e.g. ground) to lead HP. As will be explained with reference to FIG. 5, only one of the gates TG1, TG2, and TG3 can be in the conducting (ON) state at any one time such that the voltage on lead HP will be $+V$, midrail, or $-V$. If only a single supply voltage V is available, then for example the gates TG1, TG2, and TG3 may be connected to V, V/2, and 0 volts, respectively.

Timing signal generator TSG is provided with clock pulses Fc and the frequency Fr and provides a preset pulse to counter CTR on lead P and a start pulse on lead S to controller TGC. Signal A is fed to the up/down command input. If a pulse is being cancelled by pulse swallow circuit PS, then signal A is a logic "1" and causes counter CTR to count down in response to clock pulses Fo and if no pulse is being swallowed signal A is a logic "0" and this causes counter CTR to count up.

On receipt of a preset signal on lead P, the counter is preset with the value n and then counts up or down in dependence upon whether signal A is a "0" or "1". When the counter reaches the all-0's state, gate NOR provides an output pulse which, in addition to being fed to input STP of controller TGC, prevents any further counting until the counter is again preset with the value of n.

Figure 4:
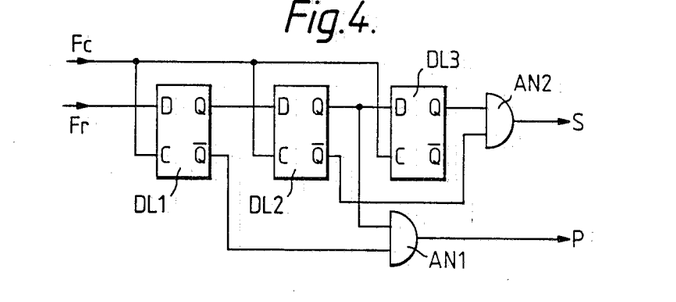
FIG. 4 is a schematic circuit diagram showing details of block TSG of FIG. 2.

FIG. 4 shows the circuit detail of the timing signal generator TSG which comprises three delay-type flip flops DL1, DL2, and DL3, and two AND-gates AN1 and AN2. As will readily be appreciated by those skilled in the art, each time signal Fr goes to "0" during a clock pulse Fc, a "1" pulse will first be given on lead P followed at the next clock pulse by a "1" pulse on lead S, each pulse having a width of one clock pulse period. This can be seen in waveforms Fc, Fr, P, and S in FIG. 6 in which the frequency Fc is fifteen times the frequency Fr. The Fr transitions are not necessarily coincident with an Fc edge so that, to maintain consistent pulse widths, the P pulses are initiated by the first positive-going Fc edge following a negative-going Fr edge rather than by the Fr edge itself. The exact timing of the Fr edge within any Fc cycle is therefore immaterial so far as the operation of the rest of the circuit is concerned, as indicated by the broken line in FIG. 6.

Figure 5:
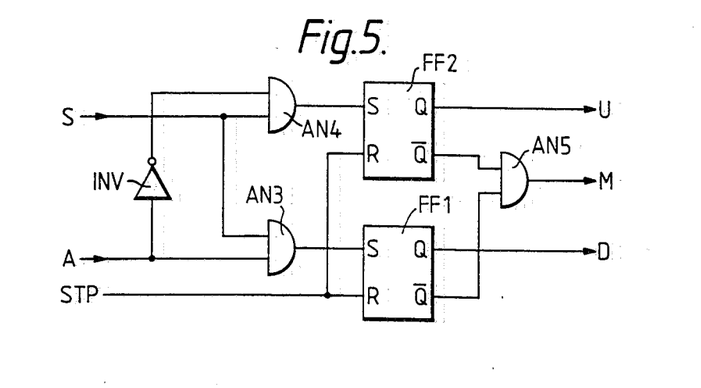
FIG. 5 is a schematic circuit diagram showing details of block TGC of FIG. 3, FIGS. 6 and 7 are diagrams showing various waveforms during operation of the synthesizer of FIG. 2.

FIG. 5 shows the circuit detail of the transmission gate controller TGC. The start pulse S is applied to respective first inputs of two AND-gates AN3 and AN4 and signal A is applied to the second input of gate AN3 and via an inverter INV to the second input of gate AN4. The outputs of gates AN3 and AN4 are fed to the respective "set" inputs of two set-reset flip-flops FF1 and FF2. The "reset" inputs of these flip-flops are fed with the stop pulse STP from up/down counter UDC. The Q outputs of flip-flops FF1 and FF2 respectively provide the U and D command signals to gates TG1 and TG3 respectively in the pulse generator PG (FIG. 3). The $\bar{Q}$ outputs of the two flip-flops are connected to the inputs of an AND-gate AN5 the output of which provides the M command signal to gate TG2 in pulse generator PG. In the all-0's condition of counter CTR, the signal STP is a "1" which holds flip-flops FF1 and FF2 in the reset state. The two "1" inputs to gate AN5 cause signal M to be "1". Signals U and D are "0" and hence only transmission gate TG2 is operated and the midrail voltage is applied to lead HP. If S, A, and STP are "1", "0", "0" respectively, the U="1" and HP=+V. If S, A, and STP are "1", "1", "0" respectively then D="1" and HP=−V.

Figure 6:
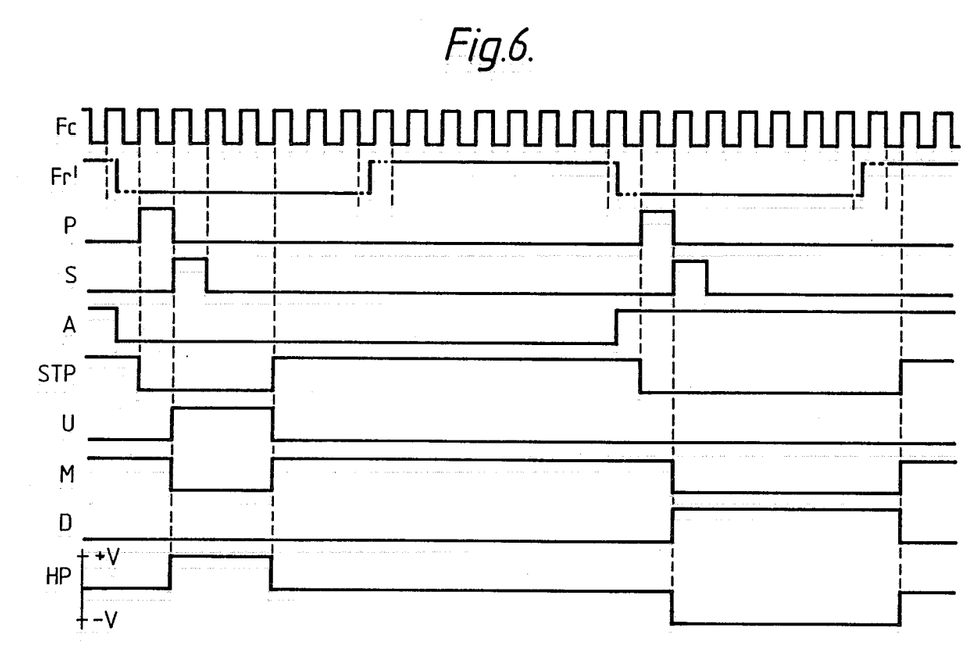

Referring now to FIG. 6, in which it is assumed that n=3 and x=10, signal A is a "1" if a cycle is to be cancelled by circuit PS and is a "0" if no cycle is to be cancelled. Each "1" pulse has a duration of one period of Fr' since it is strobed by Fr'. Fr' has the same period as Fr but leads it slightly in phase when the loop is in lock. The case where A="0" will first be described.

As explained above, the "1" pulse on signal P causes n=3 to be preset in counter CTR which has a maximum count of 9, after which it reverts to the all-0's state on the next count step. The presetting of counter CTR at "3" causes the signal STR to go to "0" and the count disable input to the counter from gate NOR is removed. At the next clock pulse, pulse S causes signal U to go to "1", signal M to go to "0", and counter CTR starts counting down (since signal A=0). When counter CTR reaches the all-0's state after three steps (=n), STP goes to "1" and therefore stops the count, causes U to go to "0", and causes M to go to "1". Throughout the whole operation, D remains at "0". As a result, the signal on HP goes from ground to +V for three clock pulses Fc, after which it reverts to ground.

Thus, it can be seen that in each period of Fr' in which a cycle is not to be cancelled (indicated by A="0"), signal HP goes to +V for a period which is directly proportional to n and hence its area is also proportional to n. Since rate multiplier RM is also controlled by n, then in every group of x=10 pulses of Fr' A="1" for three pulses and is "0" for seven (i.e. x−n) pulses. Thus, in the present example, there are (x−n) pulses each having an area proportional to +V.n.

FIG. 6 also shows the case where A="1". In this case, the counter CTR is again preset with a count of "3" but now counts the Fc pulses upwards. After seven pulses the all-0's state is reached and, during this count period, U="0", M="0", and D="1". Therefore, a pulse of −V is provided on output HP for a period of seven clock pulses. Thus, in each group of x=10 periods of Fr', there are n=3 pulses of −V each having an are a proportional to −V(x−n). Thus, the total area of the +V pulses in one direction, with respect to the midrail voltage, in the bidirectional pulse train HP is equal to the total area of the −V pulses in the other direction irrespective of the value of n.

It will be apparent that precisely the same result will be achieved if the signals M, D, and U are used to gate clock pulses to the respective transmission gates TG1, TG2, and TG3. In this case, each +V pulse on lead HP will comprise three sub-pulses and each −V pulse will comprise seven sub-pulses. All the clock pulses have the same area and so the sum of the areas of all the sub-pulses in one direction will be equal to the sum of the areas of all the sub-pulses in the other direction. As will be appreciated, for present purposes with respect to the bidirectional pulse train, a pulse in that train is still referred to as a pulse even though it may comprise a plurality of sub-pulses.

Figure 7:
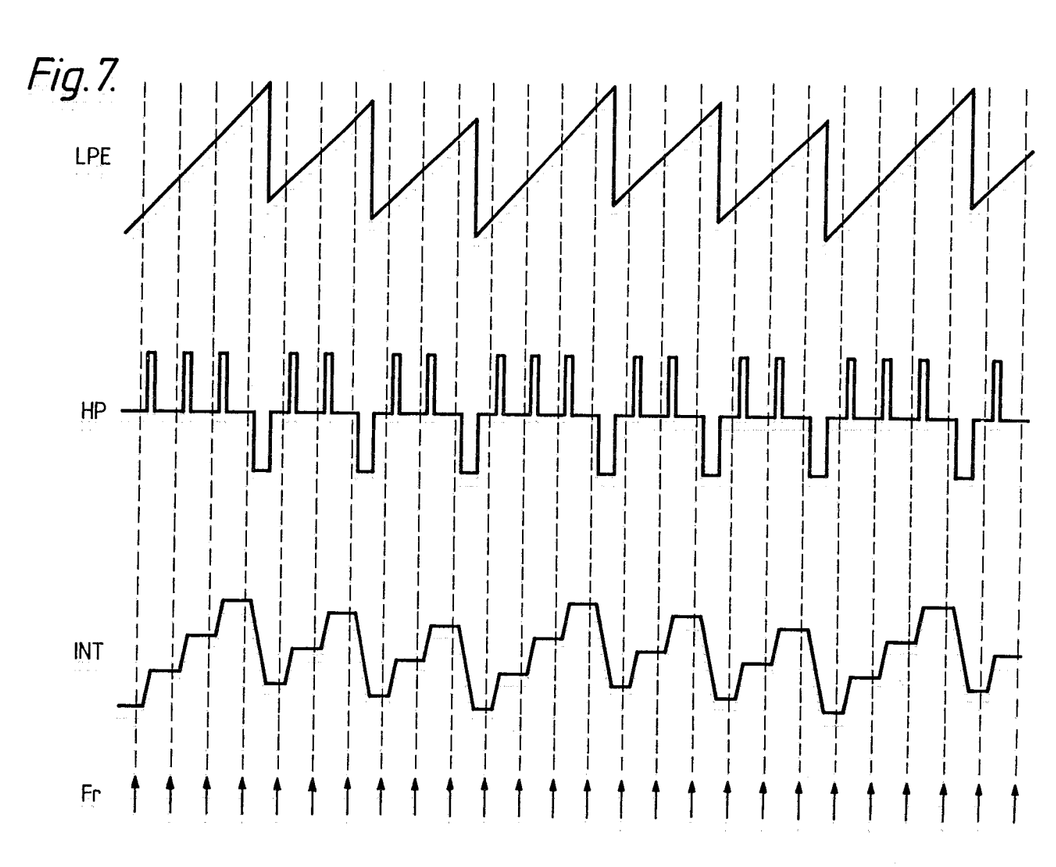

FIG. 7 shows the waveform HP on a smaller scale and the sample times at frequency Fr are shown as vertical dotted lines. The sawtooth waveform LPE shows the loop phase error at the output of the phase comparator due to the cycle cancellation by signal A. While no cycles are being cancelled, the frequency Fr' is slightly higher than the frequency Fr and so the phase error increases linearly as shown by each ramped portion of the waveform. Each time a cycle is cancelled, the phase error is reduced as shown by the vertical portions of the waveform LPE, the reduction being, in fact, 360°/(N+n/x) where N is the division factor of divider PD.

The bidirectional signal HP, which is fed to integrator INT, shows the n=3 "down" pulses corresponding to the cancelled cycles effected by signal A in every group of x=10 cycles of Fr'. The output of integrator INT is shown in waveform INT, each pulse of signal HV producing a step change in the waveform corresponding to its pulse area. It will be noted that, at the sampling times, the integrator output level corresponds with the level of the error signal LPE. The integrated signal INT alters the phase of the phase modulator PM to coincide with the loop phase error LPE and, hence, removes the effects of phase jitter in the output signal. Although the compensating signal INT is used in this embodiment to control a phase modulator, it could alternatively be added in the appropriate sense to the output signal from the phase comparator PC to oscillator VFO.

As explained above, the average DC level of the bidirectional signal remains constant irrespective of the offset frequency and, with ideal components, there is no need to provide the high pass filter HPF. However, in practical active integrators (usually based on a differential operational amplifier), there are usually small DC voltage and current offsets present on the integrator input. The input offset voltage is multiplied by one plus the magnitude of the d.c. voltage gain of the integrator to give an output offset voltage. The input offset current is multiplied by the d.c. feedback impedance to give a further output offset voltage. If a perfect integrator were to be used to integrate a bidirectional voltage signal, the d.c. voltage gain and the d.c. feedback impedance would both be infinite and hence the output would saturate. The introduction of leakage by placing a resistor across the integrating capacitor will reduce both the d.c. gain and the d.c. feedback impedance to finite levels. In most practical circuits it is not, however, possible to introduce sufficient leakage to reduce the output offset due to the input offset voltage to an acceptable level without also distorting the compensation signal. For this reason it is generally preferable to include a high pass filter HPF, or a series capacitor, in the signal path to the integrator when a bidirectional voltage signal is used so that the d.c. voltage gain is zero, although the performance of the synthesizer may be adequate for some purposes without the inclusion of the filter or capacitor. If the bidirectional signal is a current rather than a voltage signal, the high pass filter may be dispensed with.

It is also to be noted that, as explained above, the output signal of integrator INT is constant at the sampling times. Thus, any small variation of the sampling times will have no effect.

If the value of n were changed for example to 1, with x remaining at 10, then there would be nine "up" pulses in waveform HP in each group of ten pulses and one "down" pulse. Each "up" pulse would be one clock pulse wide and the "down" pulse would be nine clock pulses wide. Thus, the sum of the areas of a single "up" and a single "down" pulse would be proportional to ten clock pulses, i.e. the same as for the n=3 case or, indeed, for any value of n. Therefore, no distortion is introduced into the correction signal at the cycle cancellation instants when n is changed.

If n=0, the offset frequency is zero and no cycles are cancelled by circuit PS. Thus, there is no phase jitter to be compensated for and signal HP should therefore remain at the midrail DC voltage. This condition is satisfied in that, on each P pulse, the counter UDC is set to the "all-0's" state by n="0" and signal STP remains at "1". This in turn holds signal M at "1" and signal HP remains at the midrail potential.

In the foregoing embodiment, the areas of the pulses are controlled by pulse width modulation. The pulse areas may alternatively be controlled by pulse height modulation, or by a combination of both. Pulse height modulation may, in some cases, be the more convenient method where the input value n/x is in analogue form. Thus, for example, the offset frequency source OFS in FIG. 1 may be a voltage-controlled oscillator, in which case the input voltage to the oscillator is proportional to n, and may be used to control the height of constant-width pulses in the bidirectional signal. In such a case, up/down counter UDC and pulse generator PG could be replaced by a constant width pulse generator, for example a one-shot multivibrator, and a pulse height controller. The constant width pulse generator generates a single pulse in each period of Fr with a sign dependent upon the level of signal A. The pulse height controller controls three transmission gates in a similar manner to gates TG1, TG2, and TG3 shown in FIG. 3. In this case, however, the pulse widths are constant and the three gates are respectively connected to n, 0, and $-(x-n)$ volts respectively. Thus, in each group of ten pulses there will be, with respect to the 0 volt DC level, n "down" pulses each having an area proportional to $(x-n)$ and $(x-n)$ "up" pulses each having an area proportional to n.

Figure 8:
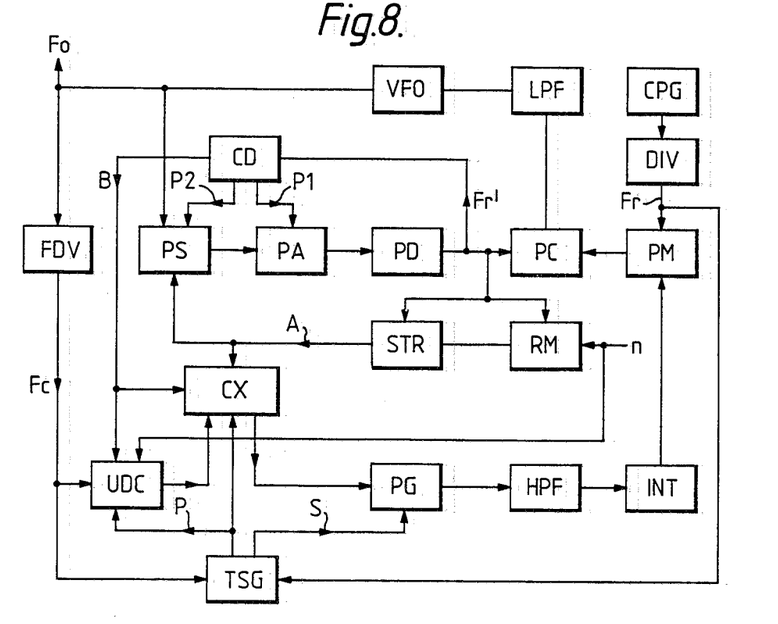
FIG. 8 is a block schematic circuit diagram of a second frequency synthesizer according to the invention.

United Kingdom Patent Application No. 8208096 describes a frequency synthesizer in which, in addition to the cancelled cycles, further cycles (pulses) are added to and subtracted from the frequency to be reduced in such a manner that the output frequency of the synthesizer is not affected. The added and subtracted pulses form an injected perturbation signal. In the event of any residual imbalance in the jitter signal compensation circuit, a spurious signal of one or more discrete frequencies is produced. This spurious signal is, in effect, mixed with the perturbation signal and is thereby spread over a wide spectrum with the result that it appears as noise at a negligibly low level. FIG. 8 shows such a synthesizer modified to provide a synthesizer according to the invention.

Figure 9:
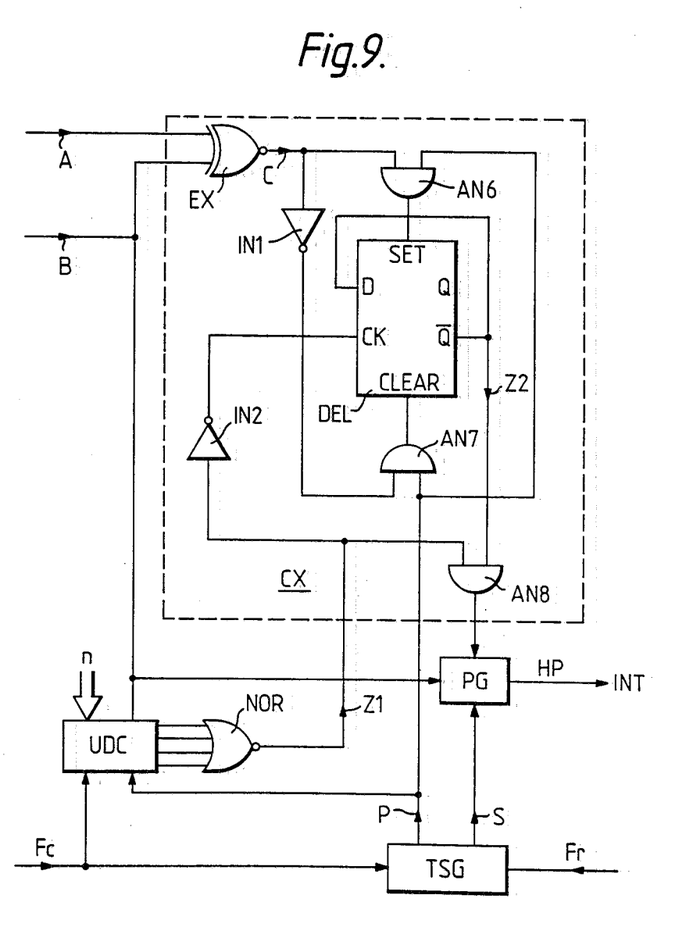
FIG. 9 is a schematic circuit diagram showing details of the synthesizer shown in FIG. 8.

In FIG. 8, circuit blocks which correspond to those in FIG. 2 have corresponding references and operate in the same manner. In UDC the connection between the output of NOR and the disable input of CTR shown in FIG. 3 must, however, be broken as shown in FIG. 9. The additional circuit blocks are a control device CD fed with strobing pulses Fr', a pulse adder PA, and a count extender CX. Control device CD provides two interspersed sequences of pulses P1 and P2. Each P1 pulse causes adder PA to add a pulse (cycle) to the frequency Fo and each P2 pulse causes pulse swallow circuit PS to cancel a pulse. A substantially equal number of P1 and P2 pulses are generated at the rate of one pulse in each period of Fr', such that over a time average, there is no net phase error introduced as a result of the control signal from device CD and so the process does not affect the DC level of the pulse train to be integrated. Thus, the frequency offset n is still sufficient information to suppress any variation in the DC level as described above. However, instead of there being only two cases to be considered, namely no pulse subtracted and one pulse to be subtracted, there are now four cases since device CD can additionally cause a further pulse to be subtracted or a pulse to be added in each period of frequency Fr'. In terms of added pulses, the four cases are thus +1, 0, −1, and −2 pulses. This must be taken into account by increasing the area of the pulse to be integrated in the "+1" and "−2" cases from that in the "0" and "−1" cases by an amount that will produce an additional phase correction of one output cycle. This amount is equal to the sum of the areas of a pulse in the "0" case and a pulse in the "−1" case. Since the sum of the areas is proportion to n+(x−n), the added area must be proportional to x and, to achieve this, count extender CX must cause the up/down counter UDC to perform an additional full count of x in the "+1" and "−2" cases.

As explained with reference to FIG. 2, signal A is "0" if no pulse is to be subtracted by circuit PS and "1" if a pulse is to be subtracted. The four cases are summarized in the Table, in which signal C is derived from signals A and B and is a "1" for each of the two new cases in which the count has to be extended by x.

TABLE

| Signal | | | Pulses added | Bidirectional Pulse | |
|---|---|---|---|---|---|
| A | B | C | per Fr' period | Polarity | Width |
| 0 | 0 | 1 | +1 | up | n + x |
| 1 | 0 | 0 | 0 | up | n |
| 0 | 1 | 0 | −1 | down | x − n |
| 1 | 1 | 1 | −2 | down | (x − n) + x |

A practical embodiment of count extender CX is shown in FIG. 9 together with the circuit connection to circuit blocks UDC, TSG, and PG of FIG. 8. The relevant waveforms are shown in FIG. 10.

Count extender CX comprises an EXCLUSIVE-NOR gate EX, two inverters IN1 and IN2, three AND gates, and a clocked delay flip-flop DEL having set and clear inputs. Gate EX derives signal C from signals A and B as shown in the Table. The two inverters IN1 and IN2, the two AND gates AN6 and AN7, and the flip-flop DEL constitute a well known presettable one-bit counter in which the signal P functions as the preset load command. The "all-0's" output Z1 of counter CTR is fed from gate NOR via inverter IN2 to the clock input CK of flip-flop DEL and to one input of gate AN8. The other input of gate AN8 is connected to the $\bar{Q}$ output of flip-flop DEL and the signal Z2 thereon is "1" when no bit is held in the flip-flop. The operation of the circuit can be seen from FIG. 10 in which waveform CX is the output of extender CX which has the same function as stop signal STP shown in FIG. 6. Since the pulses out of PG can be up to x+(x−1) Fc cycles in duration, the frequency Fc has to be at least 2x times the frequency Fr. In this example, x and n are again 10 and 3, respectively, and Fc=24 Fr. The frequency Fc is not shown in FIG. 10.

Figure 10:
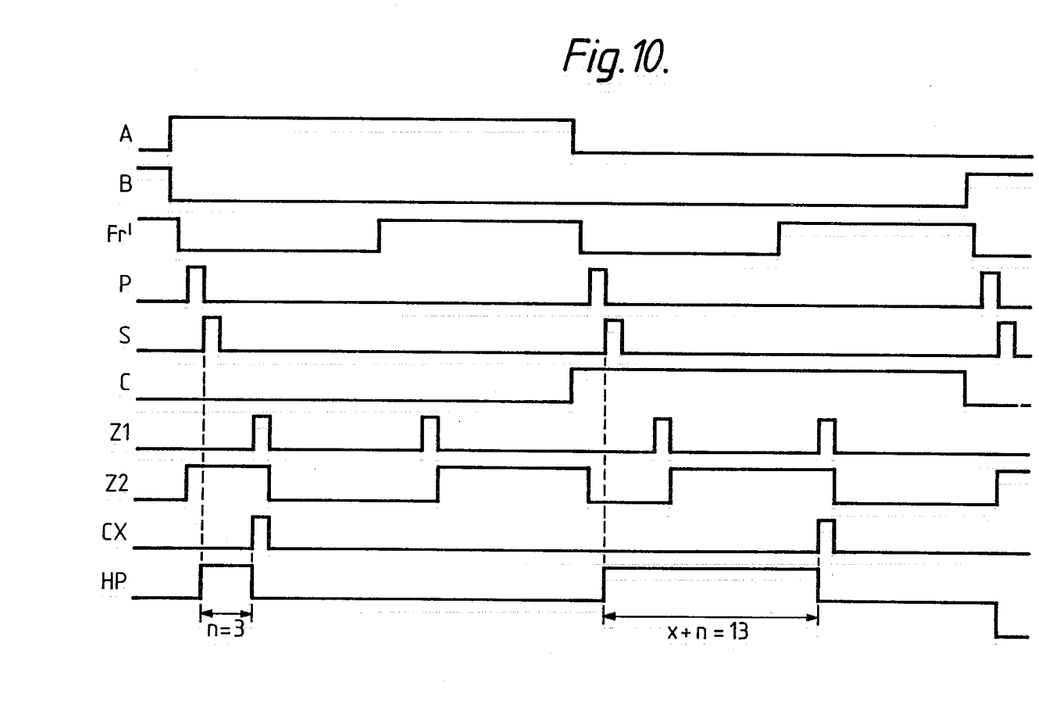
FIG. 10 is a diagram showing various waveforms during operation of the synthesizer shown in FIGS. 8 and 9.

The left-hand half of FIG. 10 shows the case where signal A="1" causes a pulse to be subtracted and signal B="0" indicates that a pulse is to be added by circuit blocks PS and PA, respectively. This case is shown on the second line of the Table. Signals P and S are the same as described with reference to FIG. 6. When P goes to "1" with C="0" and Z1="0", gate AN7 is enabled and Z2 goes to "1". Counter UDC is loaded with n=3 and counts down to the "all-0's" state, under the control of the clock pulses Fc, so that after three clock pulses signal Z1 goes to "1". Gate AN8 is therefore enabled and its output CX goes to "1", thereby terminating the output pulse HP from generator PG. Since a pulse has been added and also subtracted, by blocks PA and PS respectively, the net effect is zero and no phase error has been introduced. Thus, the "up" pulse in signal HP has a duration of n=3 clock pulses, i.e. the same as for the case described above with reference to the left-hand side of FIG. 6 in which no pulse is subtracted.

The right-hand side of FIG. 10 shows the case where signal A="0" results in no pulse being subtracted by swallower PS and signal B="0" again indicates that a pulse is to be added by circuit PA. This case is shown on the first line of the Table. Signal C is "1" and gate AN6 is, therefore, enabled by the next P pulse. Flip-flop DEL is set and signal Z2 goes to "0". Counter UDC again counts to the "all-0's" state from n=3 but gate AN8 is inhibited by Z2="0". At the end of the Z1 pulse, the clock input CK of the flip-flop goes to "1" (due to inverter IN2) and the Z2="0" signal at the D input clears the flip-flop, with the result that signal Z2 goes to "1". No stop pulse CX is fed to pulse generator PG and so the HP signal remains at 1. After a further count of x=10 pulses, counter UDC again reaches the "all-0's" state and signal Z1 again goes to "1". Gate AN8 is therefore enabled and the resultant CX pulse terminates the HP signal, which signal thus has a duration of x+n=13 clock pulses.

At the extreme right-hand side of FIG. 10, signal B is shown as going to "1" while signal A remains at "0", this case being given on the third line of the Table. Since B="1", the output HP pulse to the integrator will be a down pulse as shown and it will be appreciated from the foregoing that this down pulse will have a duration of x−n=7 clock pulses. For the case with A="1", B="1" shown on the last line of the Table, the HP pulse will be a down pulse having a duration of 2x−n=17 clock pulses.

Figure 11:
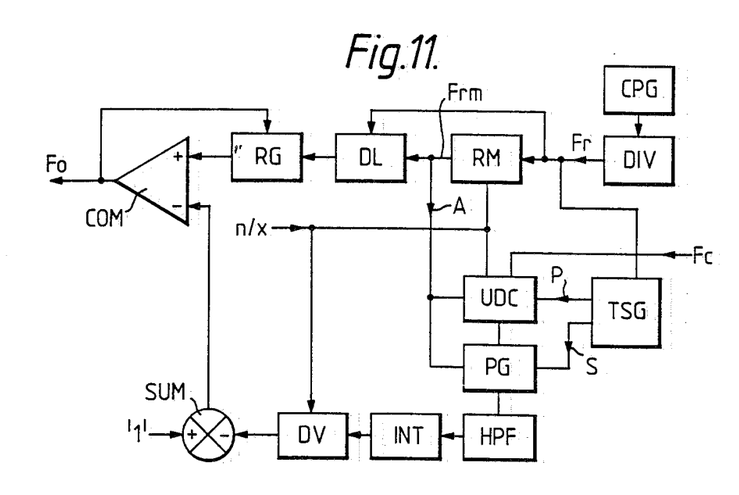
FIG. 11 is a block schematic circuit diagram of a third frequency synthesizer according to the invention.

FIG. 11 shows a direct type of frequency synthesizer in which the output frequency Fo is derived directly from the output of a clock pulse generator CPG via frequency reduction means including a programmable frequency divider DIV and a rate multiplier RM which multiplies the frequency Fr by a fraction n/x by cancelling (x−n) pulses in each group of x pulses to provide a lower frequency Frm=(n/x)Fr.

The output of rate multiplier RM is fed via a single period delay DL to the start circuit S of a voltage ramp generator. The output of ramp generator RG is fed to the non-inverting input (+) of an analogue comparator COM comprising, for example, a differential operational amplifier. The output of the comparator COM constitutes the output frequency Fo of the synthesizer and is also fed to the reset input R of the ramp generator RG.

The jitter compensation signal circuit comprises a timing signal generator TSG, an up/down counter UDC, a pulse generator PG and an integrator INT. The output of integrator INT is fed via an amplitude divider DV having a division factor determined by n/x. Since x is a constant for any particular synthesizer it is sufficient that DV divides the amplitude by n. The output of divider DV is fed to one input of an analogue summer SUM having a constant level "1" connected to its other input. The output of summer SUM is connected to the inverting input (−) of comparator COM.

The operation of the circuit is as follows.

The output pulses of rate multiplier RM are synchronized with the input pulses Fr and, due to the pulse cancellation in the rate multiplier, they have phase jitter with respect to an evenly-spaced pulse train of the same frequency. The purpose of the remaining circuitry is to compute the phase errors between the rate multiplier output and a said evenly-spaced pulse train and thereby remove the jitter errors. An analogue signal which is a function of the phase errors is derived from the output Frm of rate multiplier by circuit blocks TSG, UDC, PG, HPF, and INT in the same manner as described above with reference to FIGS. 2 to 5. The clock pulse frequency Fc may be derived, for example, from clock pulse generator CPG with the proviso that, since counter UDC has to count up to x−1 pulses of Fc in each period of Fr, Fc≧x.Fr.

The integrated bidirectional compensation signal from integrator INT is divided in amplitude by n in the divider DV. The analogue signal of divider DV is now proportional to the time advances required in the rate multiplier output in order to produce an evenly-spaced train. However, because the ramp generator RG and comparator RM are only able to delay the rate multiplier output pulses, it is necessary to offset the value of the output of divider DV by an analogue voltage which represents one whole period ("1") of the pulses. This is effected by the complementary summing circuit SUM.

Production of evenly-spaced output pulses is as follows. An output pulse from the rate multiplier RM is delayed by delay DL for one clock period Fr to allow time for the analogue integration process to take place. This delayed pulse is then applied to the start input S of the ramp generator RG and causes generator RG to produce a ramp voltage at its output to the non-inverting (+) input of comparator COM. The voltage proportional to the required delay is fed to the inverting (−) input of comparator COM from summing circuit SUM. When the ramp voltage reaches this delay voltage, the comparator output goes high and, in turn, resets the ramp generator via its input R. The synthesizer output, thus, consists of a very short output pulse from comparator COM. Further outputs from the rate multiplier are similarly delayed by the correct respective amounts resulting in an evenly-spaced train of frequency Fo=(n/x)Fr at the comparator output.

The summing circuit SUM, the ramp generator RG and comparator COM together constitute a programmable delay generator which is controlled by the compensation signal from amplitude divider DV such that the output pulses of the delay generator are respectively delayed by such an amount that the periods of occurrence are equal.

The amplitude divider DV may, for example, consist of a multiplying digital-to-analogue converter programmed with 1/n. As is self-evident to those skilled in the art, the function of DV is to divide the amplitude of the compensation signal by n and, hence, it may be placed at any point in the compensation loop PG-HPF-INT-SUM-COM. It may also be incorporated in the pulse coding, for example, by multiplying the clock frequency Fc to UDC by n.

I claim:

1. A frequency synthesizer comprising a reference frequency generator coupled to a frequency control circuit which includes a variable frequency reduction means including a cycle cancellation icrcuit arranged to cancel a cycle of the frequency to be reduced by the variable frequency reduction means for each input pulse to the cycle cancellation circuit from an offset frequency generator, the offset frequency generator being arranged to produce n pulses for each group of x pulses of a given frequency Fr to provide a variable offset frequency (n/x)Fr where n is an integer smaller than x, and further comprising a jitter compensation signal circuit connected to the frequency control circuit, an output of the jitter compensation signal circuit being arranged such that a compensation signal at the output causes compensation, at least partly, for any jitter in the period of the output frequency of the synthesizer that would otherwise be caused as a result of each cancelled cycle, the jitter compensation signal circuit deriving the compensation signal as a function of the offset frequency via an analogue integrator, characterized in that the jitter compensation signal circuit further includes means for generating, with respect to a given d.c. level, a bidirectional signal such that, for each group of x periods of the given frequency Fr, there are n periods over each of which an integral of the bidirectional signal is proportional to −(x−n), and (x−n) periods of the given frequency Fr over each of which an integral of the bidirectional signal is correspondingly proportional to n.

2. A frequency synthesizer as claimed in claim 1, wherein the bidirectional signal consists of a train of bidirectional pulses with respect to the given d.c. level such that one pulse occurs during every Fr period.

3. A frequency synthesizer as claimed in claim 2, wherein the pulses in the bidirectional pulse train have a constant amplitude and the integral over each Fr period is controlled by varying the pulse widths.

4. A frequency synthesizer as claimed in claim 1, 2, or 3 wherein the integral of the bidirectional signal over any Fr period is an inverse function of the output frequency.

5. A frequency synthesizer as claimed in claim 1, 2 or 3, wherein the variable frequency reduction means further includes means for, independently of any cycles cancelled by said input pulses from the offset frequency generator, adding cycles to and subtracting cycles from the frequency to be reduced such that an average number of added cycles is substantially equal to an average number of subtracted cycles, and further comprising means for, in each period of the given frequency Fr in which a cycle is added or subtracted, increasing the integral of the bidirectional signal over that Fr period by an amount proportional to x.

6. A frequency synthesizer comprising a reference frequency generator and a circuit for producing an output signal the frequency of which has a specific but variable ratio to that of an output signal of said reference frequency generator, said circuit having a first input for a reference frequency, the first input being coupled to the output of said reference frequency generator, a second input for a control signal for the phase of an output signal of said circuit, and an output coupled to an output of the synthesizer, said circuit including a frequency divider arrangement having a variable division ratio which determines said specific but variable ratio, said frequency divider arrangement including means for periodically cancelling an effect which a cycle of an input signal to said arrangement would otherwise have on an output signal of said arrangement and thereby each time delaying an occurrence of a next cyle of the output signal of said arrangement, the delay of the next cycle occurring for n out of every x cycles of the output of signal of said arrangement, the synthesizer further comprising a coupling to the second input from a point in said circuit at which occurs a signal containing information about jitter which would otherwise occur in the period of the output signal of said circuit due to jitter in the period of the output signal of said frequency divider arrangement caused by operation of said means, for applying a control signal to said second input to thereby compensate for the jitter which would otherwise occur in the output signal of said circuit, said coupling including an analog integrator, characterized in that said coupling also includes, prior to said analog integrator, means for generating, with respect to a given d.c. level, a bidirectional signal an integral of which is proportional to −(x−n) over each period occupied by a cycle of the output signal of said arrangement which immediately precedes a delayed cycle of the output signal of said arrangement and is proportional to n over each period occupied by a cycle of the output signal of said arrangement which does not immediately precede a delayed cycle of the output signal of said arrangement.

7. A synthesizer as claimed in claim 6, wherein the bidirectional signal consists of a train of bidirectional pulses with respect to said given d.c. level such that one pulse occurs in each period occupied by a cycle of the output signal of said arrangement.

8. A synthesizer as claimed in claim 7, wherein pulses of the bidirectional signal have a constant amplitude and an integral over each period occupied by a cycle of the output signal of said arrangement is controlled by varying the pulse widths.

9. A synthesizer as claimed in claim 6, 7, or 8, wherein the integral of the bidirectional signal over each period occupied by a cycle of the output signal of said arrangement is an inverse function of the frequency of the output signal of said circuit.

10. A modification of a synthesizer as claimed in claim 6, 7, or 8, wherein said frequency divider arrangement further includes means for periodically cancelling an effect which a further cycle of the input signal to said arrangement would otherwise have on the output signal of said arrangement and periodically creating in the output signal of said arrangement an effect of substantially a same number of cycles as said further cycles added to the input signal of said arrangement so that overall, for each cycle of the output signal of said arrangement, an occurrence of a next cycle of said output signal will either (a) be delayed by one period of the input signal of said arrangement, (b) be delayed by two periods of the input signal of said arrangement, (c) be advanced by one period of the input signal of said arrangement, or (d) be neither advanced nor delayed, said means for generating a bidirectional signal being constructed to generate a bidirectional signal an integral of which over each period occupied by a cycle of the output signal of said arrangement is proportional to $-(x-n)$ in case (a), $-(2x-n)$ in case (b), $(n+x)$ in case (c), and n in case d.

11. A modification of a synthesizer as claimed in claim 9, wherein said frequency divider arrangement further includes means for periodically cancelling an effect which a further cycle of the input signal to said arrangement would otherwise have on the output signal of said arrangement and periodically creating in the output signal of said arrangement an effect of substantially a same number of cycles as said further cyles added to the input signal of said arrangement so that overall, for each cycle of the output signal of said arrangement, an occurrence of a next cycle of said output signal will either (a) be delayed by one period of the input signal of said arrangement, (b) be delayed by two periods of the input signal of said arrangement, (c) be advanced by one period of the input signal of said arrangement, or (d) be neither advanced nor delayed, said means for generating a bidirectional signal being constructed to generate a bidirectional signal an integral of which over each period occupied by a cycle of the output signal of said arrangment is proportional to $-(x-n)$ in case (a), $-(2x-n)$ in case (b), $(n+x)$ in case (c), and n in case d.

12. A frequency synthesizer comprising a reference frequency generator and a circuit for producing an output signal the frequency of which has a specific but variable ratio to that of an output signal of said reference frequency generator, said circuit having a first input for a reference frequency, the first input being coupled to the output of said reference frequency generator, a second input for a control signal for the phase of the output signal of said circuit, and an output coupled to an output of the synthesizer, said circuit including a frequency divider arrangement having a variable division ratio which determines said specific but variable ratio, said frequency divider arrangement including means for periodically cancelling an effect which a cycle of an input signal to said arrangement would otherwise have on the output signal of said arrangment and thereby each time supressing a cycle of the output signal of said arrangement which would otherwise occur, the suppression of a cycle of the output signal of said arrangement occurring for n out of every x cycles of the output signal of said arrangement which would otherwise occur, the synthesizer further comprising a coupling to the second input from a point in said circuit at which occurs a signal containing information about jitter which would otherwise occur in the period of the output signal of said circuit due to jitter in the period of the output signal of said frequency divider arrangement caused by operation of said means, for applying a control signal to said second input to thereby compensate for the jitter which would otherwise occur in the output signal of said circuit, said coupling including an analog integrator, characterized in that said coupling also includes, prior to said analog integrator, means for generating, with respect to a given d.c. level, a bidirectional signal an integral of which is proportional to $-(x-n)$ over each period during which a cycle of the output signal of said arrangement which would otherwise occur is suppressed and is proportional to n over each period during which a cycle of the output signal of said arrangement is not suppressed.

13. A synthesizer as claimed in claim 12, wherein the bidirectional signal consists of a train of bidirectional pulses with respect to said given d.c. level such that one pulse occurs in each said period during which a cycle of the output signal of said arrangement which would otherwise occur is suppressed and in each said period during which a cycle of the output signal of said arrangement is not suppressed.

14. A synthesizer as claimed in claim 13, wherein the pulses of the bidirectional signal have a constant amplitude and the integral over each said period during which a cycle of the output signal of said arrangement which would otherwise occur is suppressed and over each said period during which a cycle of the output signal of said arrangement is not suppressed is controlled by varying the pulse widths.

* * * * *